United States Patent [19]

Sakai et al.

[11] 4,383,266
[45] May 10, 1983

[54] AVALANCHE PHOTO DIODE

[75] Inventors: Kazuo Sakai, Tokyo; Yuichi Matsushima, Tokorozawa; Shigeyuki Akiba, Tokyo; Takaya Yamamoto, Niza, all of Japan

[73] Assignee: Kokusai Denshin Denwa Kabushiki Kaisha, Japan

[21] Appl. No.: 187,744

[22] Filed: Sep. 16, 1980

[30] Foreign Application Priority Data

Sep. 26, 1979 [JP] Japan .................................. 54-123530
Oct. 8, 1979 [JP] Japan .................................. 54-128893

[51] Int. Cl.³ .............................................. H01L 29/90
[52] U.S. Cl. ...................................... 357/13; 357/16; 357/30; 357/52
[58] Field of Search ........................ 357/13, 16, 52, 30

[56]       References Cited
         U.S. PATENT DOCUMENTS

| 3,886,579 | 5/1975 | Ohuchi | 357/13 |
| 3,889,284 | 6/1975 | Schiel | 357/13 X |
| 3,959,646 | 5/1976 | de Cremour | 357/13 X |
| 4,079,405 | 3/1978 | Ohuchi | 357/52 X |
| 4,127,932 | 12/1978 | Hartman | 357/13 X |
| 4,258,375 | 3/1981 | Hsieh | 357/13 X |

Primary Examiner—Martin H. Edlow
Attorney, Agent, or Firm—Robert E. Burns; Emmanuel J. Lobato; Bruce L. Adams

[57]       ABSTRACT

An avalanche photo diode provided with a guard ring around a photo detecting region having a pn junction, in which semiconductor layers of the photo detecting region having a pn junction, different in conductivity type from a semiconductor of the guard ring, are composed of a second semiconductor layer formed in contact with a first semiconductor layer forming the pn junction of the photo detecting region and of the same conductivity type as the semiconductor of the guard ring, and a third semiconductor layer formed in contact with the second semiconductor layer and having a larger band gap than the second semiconductor layer, and in which the tip end of the guard ring is formed to extend down into the third semiconductor layer. An avalanche photo diode can be formed to be provided with a uniformly thick, first semiconductor layer forming a photo detecting region and a second semiconductor layer forming a first pn junction between it and the first semiconductor layer, in which third and fourth semiconductor layers of the same composition as each other, respectively having larger band gaps than those of the first and second semiconductor layers, are provided to form therebetween a second pn junction which extends from the first pn junction to surround the peripheral portion of the first semiconductor layer.

3 Claims, 22 Drawing Figures

AVALANCHE PHOTO DIODE

BACKGROUND OF THE INVENTION

This invention relates to an avalanche photo diode provided with a hetero junction, and more particularly to an improvement in a guard ring structure provided for the purpose of preventing a breakdown at the peripheral portion of a photo detecting region.

Of various semiconductor photo detectors, an avalanche photo diode (hereinafter referred to simply as "APD") is a photo detector having characteristics of high sensitivity and wide band, and is widely employed in optical communications.

The APD performs amplification of a photocurrent by applying a reverse bias voltage to its pn junction to cause an avalanche multiplication under a high electric field. This develops a defect such that before the avalanche multiplication of the photocurrent occurs, electric fields center on the peripheral portion of the photo detecting region to cause a breakdown there.

To remove the abovesaid defect of the prior art, there has been proposed an APD in which a ring-shaped layer, commonly referred to as a guard ring, is provided to surround the photo detecting region, such as a single-element APD made of Ge or Si. However, a sufficient increase of the breakdown voltage cannot be attained by the provision of the conventional guard ring.

SUMMARY OF THE INVENTION

In view of the abovesaid defects of the prior art, an object of the present invention is to provide an avalanche photo diode in which the portion of the guard ring having a large curvature is formed in a semiconductor of a large band gap to provide for an increased breakdown voltage for preventing the breakdown.

In accordance with this invention, there is proposed an avalanche photo diode, which is provided with a guard ring around a photo detecting region having a pn junction, characterized in that semiconductor layers of the photo detecting region having a pn junction, different in conductivity type from a semiconductor of the guard ring, are composed of a second semiconductor layer formed in contact with a first semiconductor layer forming the pn junction of the photo detecting region and of the same conductivity type as the semiconductor of the guard ring and a third semiconductor layer formed in contact with the second semiconductor layer and having a larger band gap than the second semiconductor layer, and in that the tip end of the guard ring is formed to extend down into the third semiconductor layer. In the above avalanche photo diode, the band gap of the semiconductor forming the guard ring is larger than the band gaps of the respective semiconductors of the second and third semiconductor layers.

In accordance with this invention, there is further proposed an avalanche photo diode, which is provided with a uniformly thick, first semiconductor layer forming a photo detecting region and a second semiconductor layer forming a first pn junction between it and the first semiconductor layer, characterized in that third and fourth semiconductor layers of the same composition as each other, respectively having larger band gaps than those of the first and second semiconductor layers, are formed provided to form therebetween a second pn junction which extends from the first pn junction to surround the peripheral portion of the first semiconductor layer.

BRIEF DESCRIPTION OF THE DRAWINGS

This invention will be described in detail below in comparison with conventional devices with reference to the accompanying drawings, in which.

DETAILED DESCRIPTION OF THE INVENTION

For readily understanding this invention, an example of conventional device will first be described.

Figure 1A:
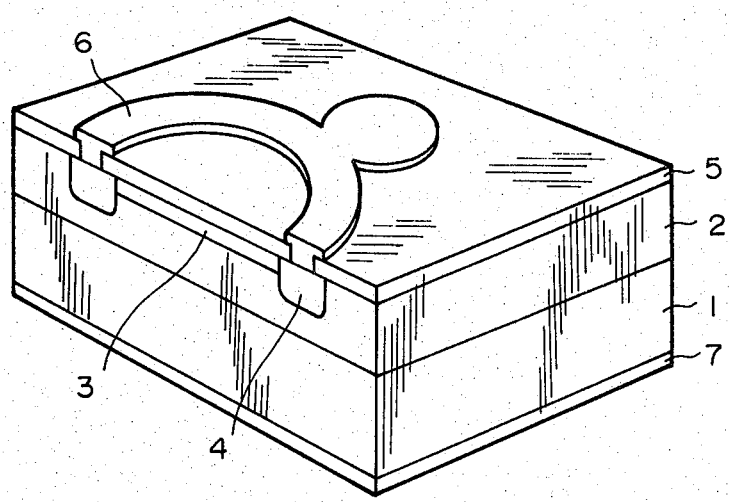
FIGS. 1A and 1B are perspective views showing an example of a conventional avalanche photo diode.
Figure 1B:
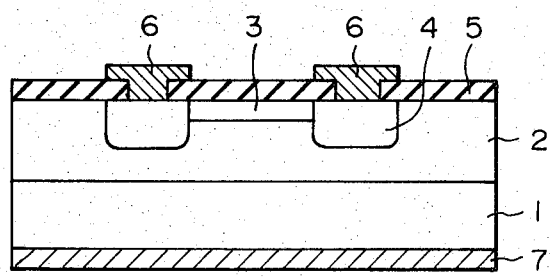

FIG. 1A shows its perspective view including a section and FIG. 1B its cross-sectional view. In FIGS. 1A and 1B, reference numeral 1 indicates a high concentration n type semiconductor substrate; 2 designates a low concentration n type semiconductor layer; 3 identifies a photo detecting region of a high concentration p type semiconductor, which forms a pn junction between it and the low concentration n type semiconductor layer 2; 4 denotes a guard ring of a p type semiconductor; 5 represents an insulator; and 6 and 7 show electrode metals. In this prior art device; the carrier concentration in the guard ring 4 is selected to be lower than the carrier concentration in the photo detecting region 3 to reduce the electric field in the guard ring 4 so that no breakdown occurs around the photo detecting region during multiplication of the photo-current. The guard ring 4 is formed by diffusing means.

On the other hand, a 1 to 1.7 μm wavelength band has recently been taken notice of as an effective band for optical communication and, as an APD for use in this band, a quaternary or ternary APD has come to be produced which is represented by a compositional equation, $In_{1-x}Ga_xAs_yP_{1-y}$ ($0.42y \leq x \leq 0.5y$, $0 < y \leq 1$). In this $In_{1-x}Ga_xAs_yP_{1-y}$ system, there is still left unsolved the problem that breakdown is liable to occur around the photo detecting region; as a solution to this problem, it is considered to provide a guard ring as in the prior art example shown in FIGS. 1A and 1B. In the $In_{1-x}Ga_xAs_yP_{1-y}$ system, however, a p type region of low concentration is very difficult to form by the same diffusion method as employed in the past; namely, no sufficient difference in the carrier concentration is provided between the photo detecting region and the guard ring so that electric fields center on the guard ring, in particular, a portion of a large curvature to cause a breakdown.

With reference to the accompanying drawings, the present invention will hereinafter be described in detail.

Figure 2:
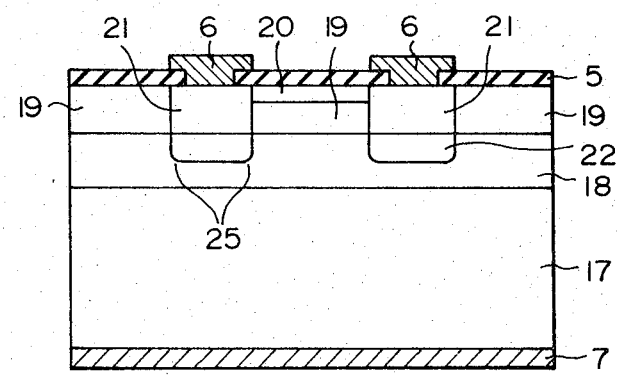
FIGS. 2, 3 and 4 are cross-sectional views illustrating embodiments of the present invention.

FIG. 2 illustrates, in section, an APD produced in accordance with an embodiment of the present invention. Reference numeral 17 indicates an n+-InP substrate; 18 refers to an n-$In_{1-p}Ga_pAs_qP_{1-q}$ ($0.42q \leq p \leq 0.50q$, $0 < q \leq 1$) (a third semiconductor layer); 19 identifies an n-In$_{1-x}$Ga$_x$As$_y$P$_{1-y}$ (0.42y≦x≦0.50y, 0<y<1) layer (a second semiconductor layer); 20 denotes a p$^+$-In$_{1-x}$Ga$_x$As$_y$P$_{1-y}$ layer (a first semiconductor layer), which is a photo detecting layer which forms a pn junction between it and the layer 19; 21 and 22 represent a guard ring formed of a p type semiconductor; 5 shows an insulator; and 6 and 7 refer to metal electrodes. The guard ring 21, 22 will be described in more detail. The portion 21 is formed of a p type semiconductor of the same composition as the layer 19, represented by p-In$_{1-x}$Ga$_x$As$_y$P$_{1-y}$, and the portion 22 is formed of a p type semiconductor of the same composition as the layer 18, represented by p-In$_{1-p}$Ga$_p$As$_q$P$_{1-q}$. Reference numeral 25 indicates large-curvature portions of the guard ring. The feature of the present embodiment resides in that the band gap of the layer 18 is larger than the band gap of the layer 19 and in that the p type region forming the guard ring is formed to extend into the layer 18 so that the large-curvature portions 25 of the guard ring lie in the layer 18.

It is known that a semiconductor of a larger band gap usually has a higher breakdown voltage than a semiconductor of a smaller band gap if the other conditions are the same. Accordingly, as compared with the prior art example in which the guard ring is formed only in the semiconductor of the same composition as the photo detecting region, the structure in which the guard ring is formed to extend into the semiconductor of a large band gap has a large breakdown voltage in the large-curvature portion 25 of the guard ring as in the present embodiment and hence is capable of effectively preventing the breakdown.

Next, a description will be given of the method of making the present embodiment. On the n$^+$-InP substrate 17 are sequentially grown by the liquid phase epitaxial method the n-In$_{1-p}$Ga$_p$As$_q$P$_{1-q}$ (0.42q≦p≦0.50q, 0≦q≦1) layer 18 and the n-In$_{1-x}$Ga$_x$As$_y$P$_{1-y}$ (0.42y≦x≦0.50y, 0≦y≦1) layer 19. In this case, the band gap of the In$_{1-p}$Ga$_p$As$_q$P$_{1-q}$ layer 18 is made larger than the band gap of the In$_{1-x}$Ga$_x$As$_y$P$_{1-y}$ layer 19. Next, a SiO$_2$ film which will ultimately serve as the insulator 5 is deposited by sputtering, chemical vapor deposition or the like on the wafer. Thereafter, the SiO$_2$ film overlying the area where the guard ring is to be formed is removed by photolithographic technique, and Zn is thermally diffused into the wafer using the SiO$_2$ film as a mask, thereby to form the guard rings 21, 22. After this, the SiO$_2$ film overlying the area in which the photo detecting region is to be formed is also removed by photolithographic technique, and then Zn is thermally diffused into the wafer to provide the photo detecting region using the remaining SiO$_2$ film serving as a mask. The thermal diffusions are so controlled as to cause the tip end or the bottom of the guard ring to lie in the In$_{1-p}$Ga$_p$As$_q$P$_{1-q}$ layer 18 and the pn junction of the photo detecting region to lie in the In$_{1-x}$Ga$_x$As$_y$P$_{1-y}$ layer 19 after completion of the thermal diffusions. Then, after a SiO$_2$ film is deposited again on the wafer to form an anti-reflecting coating, the SiO$_2$ film overlying the guard ring portion is etched away to provide a site for attachment of an upper electrode. An upper electrode 6 is formed by vacuum deposition and photolithographic technique. Next, after polishing the underside of the InP substrate 17, a lower electrode 7 is formed by vacuum vapor deposition. Finally, the electrodes are subjected to heat treatment, thus providing an APD in the complete form.

Figure 3:
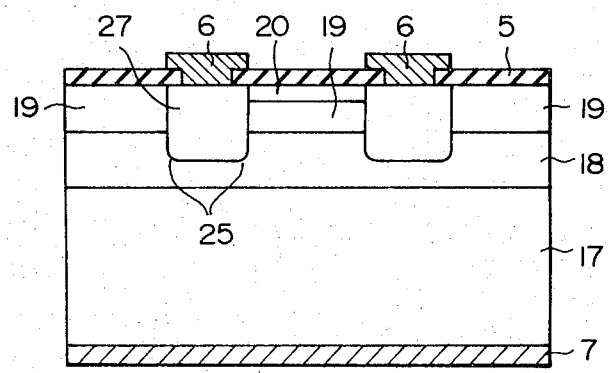

Next, another embodiment of the present invention will be described. In the embodiment of FIG. 2, the guard rings 21, 22 are formed of semiconductors of different band gaps, but the guard ring may also be formed of semiconductors of the same composition. In this case, it is necessary that the band gap of the semiconductor forming the guard ring is larger than the band gap of the semiconductor adjoining the guard ring. FIG. 3 shows in section and APD of this embodiment. The method for the manufacture of the APD of this embodiment will be described, by way of example, to form the guard ring by the crystal growth method. On the n$^+$-InP substrate 17 are sequentially grown by the liquid phase epitaxial method the n-In$_{1-p}$Ga$_p$As$_q$P$_{1-q}$ (0.42q≦p≦0.50q, 0≦q≦1) layer 18 and the n-In$_{1-x}$Ga$_x$As$_y$P$_{1-y}$ (0.42y≦x≦0.50y, 0≦y≦1) layer 19. In this case, the band gap of the In$_{1-p}$Ga$_p$As$_q$P$_{1-q}$ layer is made larger than the band gap of the In$_{1-x}$Ga$_x$As$_y$P$_{1-y}$ layer. Next, a SiO$_2$ film is deposited by sputtering or chemical vapor deposition or the like on the wafer. Thereafter, the SiO$_2$ film overlying the area in which the guard ring is to be formed is removed by photolithographic technique, and the layers 18 and 19 are selectively removed using the SiO$_2$ film used as a mask to form a groove extending down into the layer 18, and then a p-In$_{1-l}$Ga$_l$As$_m$P$_{1-m}$ (0.42m≦l≦0.50m, 0≦m≦1) layer 27 is selectively grown in the groove to form the guard ring. The band gap of the In$_{1-l}$Ga$_l$As$_m$P$_{1-m}$ forming the guard ring is made larger than the band gaps of the layers 18 and 19. Following this, the SiO$_2$ film overlying the area in which the photo detecting region is to be formed is removed by photolithographic technique, and then Zn is thermally diffused into the wafer to provide the photo detecting region using the SiO$_2$ film serving as a mask. Then, after the formation of an anti-reflecting coating, electrodes are formed and heat-treated to provide an APD in the complete form.

Figure 4:
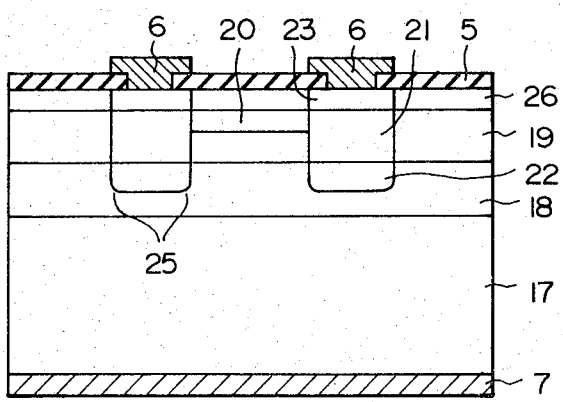

FIG. 4 illustrates another embodiment of the present invention, in which, in order to raise the quantum efficiency, as In$_{1-m}$Ga$_m$As$_n$P$_{1-n}$ layer (0.42n≦m≦0.50n, 0≦n≦1) 26 of a semiconductor having a larger band gap than the layer 19 is formed on the top of the layer 19 which performs photo detection in the APD shown in FIG. 2.

Figure 5A:
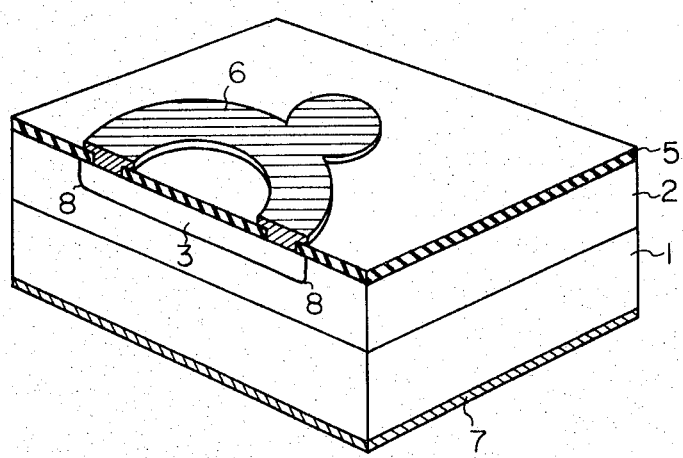
FIGS. 5A and 5B are a perspective view and a sectional view showing another example of conventional APD structure.
Figure 5B:
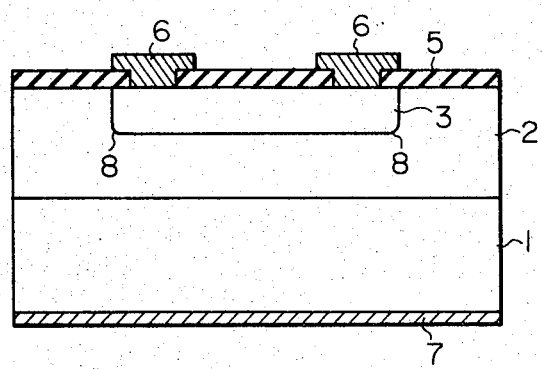

In the following, another type of the avalanche photo diode will be described. FIGS. 5A and 5B show the basic construction of a conventional APD explanatory of the peripheral portion of the photo detecting region in which the abovesaid breakdown occurs, 5A being a perspective view of one-half of the structure of the diode and 5B its sectional view. In FIGS. 5A and 5B, reference numeral 1 indicates a high concentration n type semiconductor substrate; 2 designates a low concentration n type semiconductor layer; 3 identifies a photo detecting region of a high concentration p type semiconductor; which forms a pn junction between it and the low concentration n type semiconductor layer 2; 5 denotes an insulator; and 6 and 7 represent metal electrodes. In FIGS. 5A and 5B, the part identified by 8 is that part of the photo detecting region where the undesirable breakdown occurs and the curvature of the pn junction is large.

Figure 6:
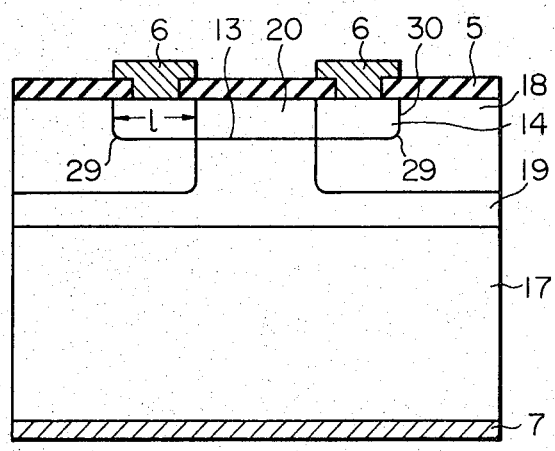
FIGS. 6, 7, 8 and 9 are sectional views illustrating embodiments of the present invention.

FIG. 6 illustrates, in section, an APD of this type produced in accordance with an embodiment of the present invention. Reference numeral 17 indicates an n$^+$-InP substrate; 19 indicates an n-In$_{1-x}$Ga$_x$As$_y$P$_{1-y}$ (0.42y≦x≦0.50y, 0≦y≦1) layer (second semiconductor layer); 20 identifies a p-$In_{1-x}Ga_xAs_yP_{1-y}$ layer (first semiconductor layer); 13 denotes a pn junction defined by the layers 19 and 20 and serving as a photo detecting region; 14 represents a p-$In_{1-p}Ga_pAs_qP_{1-q}$ (0.42q$\leq$p$\leq$0.50q, 0$\leq$q$\leq$1) layer (fourth semiconductor layer); 18 shows an n-$In_{1-p}Ga_pAs_qP_{1-q}$ layer (third semiconductor layer); 5 refers to an insulator; and 6 and 7 indicate metal electrodes. The band gaps of the $In_{1-p}Ga_pAs_qP_{1-q}$ layers 14 and 18 are selected larger than the band gaps of the $In_{1-x}Ga_xAs_yP_{1-y}$ layers 19 and 20. The feature of the present invention resides, as will be apparent from the comparison with the basic APD structure shown in FIGS. 5A and 5B, in that the portion of the photo detecting region where the curvature of the pn junction is large (identified by reference numeral 8 in FIGS. 5A and 5B and reference numeral 29 in FIG. 6) is formed in the semiconductor of large band gap. It is known that a semiconductor of a larger band gap usually has a higher breakdown voltage than a semiconductor of a smaller band gap if the other conditions are the same. Accordingly, in such a structure as in the embodiment of FIG. 6, a second pn junction 30 formed by the $In_{1-p}Ga_pAs_qP_{1-q}$ layers 14 and 18 has a larger breakdown voltage than the first pn junction 13 formed by the $In_{1-x}Ga_xAs_yP_{1-y}$ layers 19 and 20 serving as a photo detection region and hence essentially has the guard ring effect.

As will be appreciated from the above, the width of the layer 14, identified by l in FIG. 6 can freely be selected so long as such a condition is satisfied that the large-curvature portion 29 of the pn junction is formed to extend between the layers 14 and 18.

According to the embodiment of FIG. 6, since the pn junction between the semiconductors of large band gaps has a small dark current, it is possible to produce the effect which reduces the dark current around the photo detecting region.

Figure 7:
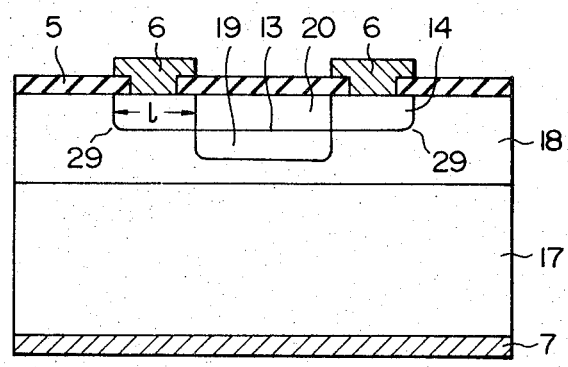

Next, another embodiment of the present invention will be described. In the embodiment of FIG. 7, the layer 19 is formed in the layer 18, and the configurations of the other layers and the object of the present embodiment are exactly the same as in the embodiment of FIG. 6.

Figure 8:
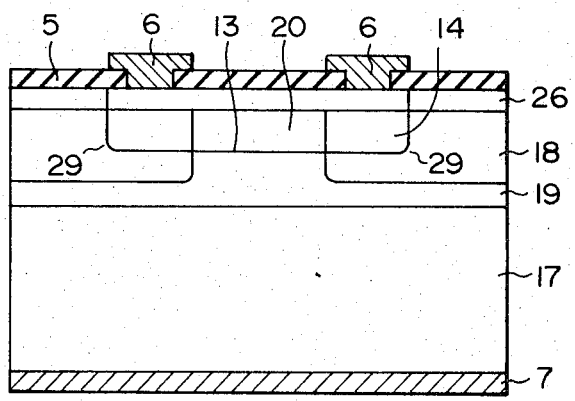
Figure 9:
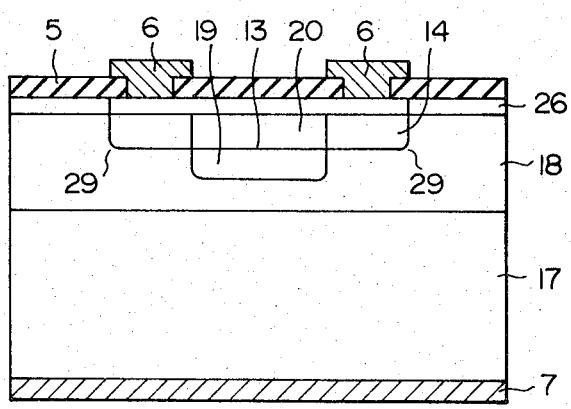

FIGS. 8 and 9 illustrate, as other embodiments of the present invention, APD structures capable of enhancing the quantum efficiency. FIGS. 8 and 9 respectively correspond to the embodiments of FIGS. 6 and 7 and are in common with that an $In_{1-m}Ga_mAs_nP_{1-n}$ (0.42n$\leq$m$\leq$0.50n, and 0$\leq$n$\leq$1) layer 26 of a semiconductor having a larger band gap than that of the layer 20 is formed on the layer 20 which is the photo detecting region, and are identical in the other points with the embodiments of FIGS. 6 and 7.

Figure 10A:
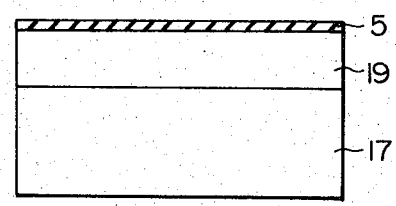
FIGS. 10A, 10B, 10C, 10D, 10E, 11A, 11B, 11C, 11D, 11E and 11F are sectional views explanatory of the manufacturing method of the avalanche photo diode of the present invention.
Figure 10B:
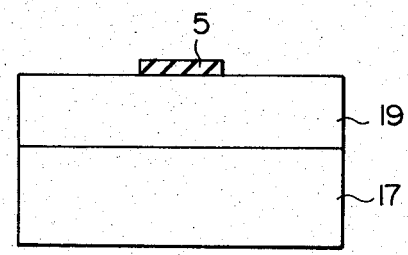
Figure 10C:
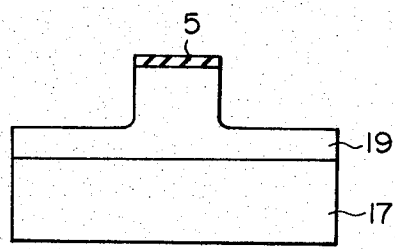
Figure 10D:
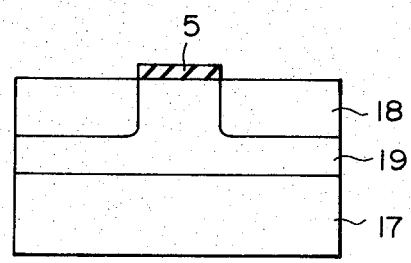
Figure 10E:
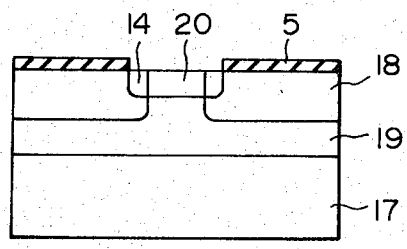

In the case of making the avalanche photo diode of the embodiment of FIG. 6, as shown in FIGS. 10A to 10E, the n-$In_{1-x}Ga_xAs_yP_{1-y}$ (0.42y$\leq$x$\leq$0.50y, and 0$\leq$y$\leq$1) layer 19 is grown by the liquid epitaxial method on the n$^+$-InP substrate 17, and then the SiO$_2$ film 5 is deposited by the chemical vapor deposition method or the like on the abovesaid layer as shown in FIG. 10A. The SiO$_2$ film is selectively removed, leaving the SiO$_2$ film on the portion which will ultimately serve as the photo detecting region as shown in FIG. 10B, and then the $In_{1-x}Ga_xAs_yP_{1-y}$ layer 19 is selectively etched away, using the remaining SiO$_2$ film 5 as a mask as shown in FIG. 10C. After selectively growing the n-$In_{1-p}Ga_pAs_qP_{1-q}$(0.42q$\leq$p$\leq$0.50q, and 0$\leq$q$\leq$1) on the wafer, using the SiO$_2$ film 5 as a mask as shown in FIG. 10D, the SiO$_2$ film 5 is removed. Then, after the SiO$_2$ film 5 is again deposited, the SiO$_2$ film overlying the photo detecting region and the surrounding regions are removed and Zn is diffused into the wafer to form the p-$In_{1-x}Ga_xAs_yP_{1-y}$ layer 20 and the p-$In_{1-p}Ga_pAs_qP_{1-q}$ layer 14. as shown in FIG. 10E. Thereafter, electrodes are attached to the assembly to complete the APD. The band gap of the $In_{1-p}Ga_pAs_qP_{1-q}$ layer 18 is selected larger than the band gap of the $In_{1-x}Ga_xAs_yP_{1-y}$ layer 19.

Figure 11A:
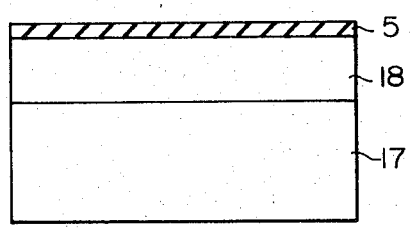
Figure 11D:
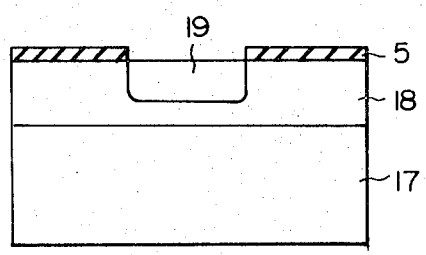
Figure 11B:
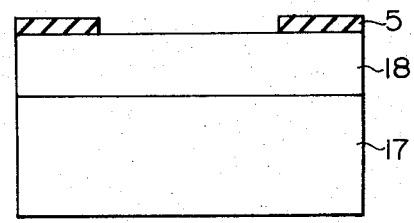
Figure 11E:
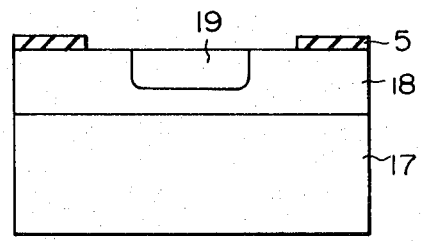
Figure 11C:
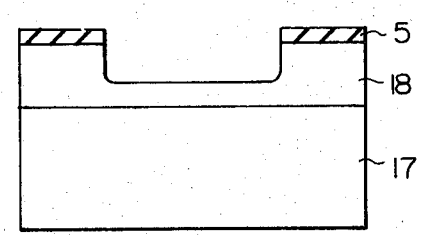
Figure 11F:
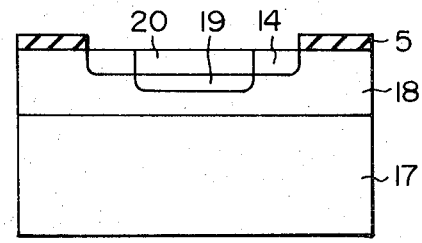

In the case of making the avalanche photo diode of the embodiment of FIG. 7, as depicted in FIGS. 11A to 11F, the n-$In_{1-p}Ga_pAs_qP_{1-q}$ (0.42q$\leq$p$\leq$0.50q, and 0$\leq$q$\leq$1) layer 18 is grown by the liquid phase epitaxial method on the n$^+$-InP substrate 17, and then a SiO$_2$ film 5 is deposited as by the chemical vapor deposition method on the above layer 18 as shown in FIG. 11A. The SiO$_2$ film on the portion which will ultimately serve as the photo detecting region is selectively removed as shown in FIG. 11B, and then the $In_{1-p}Ga_pAs_qP_{1-q}$ layer 18 is selectively etched away, using the remaining SiO$_2$ film 5 as a mask as shown in FIG. 11C. After selectively growing the n-$In_{1-x}Ga_xAs_yP_{1-y}$(0.42y$\leq$x$\leq$0.50y and 0$\leq$y$\leq$1) layer 19 on the wafer, using the SiO$_2$ film 5 as a mask as shown in FIG. 11D, the SiO$_2$ film 5 overlying the $In_{1-p}Ga_pAs_qP_{1-q}$ layer 18 which surrounds the photo detecting region is removed as shown in FIG. 11E. Zn is diffused into the wafer, using the SiO$_2$ film 5 as a mask, to form the p-$In_{1-x}Ga_xAs_yP_{1-y}$ layer 20 and the p-$In_{1-p}Ga_pAs_qP_{1-q}$ layer 14 as shown in FIG. 11F. Following this, electrodes are attached to the assembly to complete the APD. The band gap of the $In_{1-p}Ga_pAs_qP_{1-q}$ layer 18 is selected larger than the band gap of the $In_{1-x}Ga_xAs_yP_{1-y}$ layer 20.

In the embodiments of FIGS. 8 and 9, the SiO$_2$ film is entirely removed after selective growth, and then the n-$In_{1-m}Ga_mAs_nP_{1-n}$ layer is formed on the grown layer, after which the electrodes are attached.

The above embodiments have been described in connection with APD's made of the InGaAsP mixed crystal; but since the point is to form a semiconductor layer of a large band gap in the peripheral portion of the photo detecting region and extend the pn junction of the photo detecting region into the semiconductor layer of large band gap, a GaAlAsSb or like mixed crystal can also be used. It is also possible, of course, to form the APD of semiconductors of different constituent elements. The conductivity types in the above may also be reversed.

As has been described in respect of the InGaAsP system APD, according to the present invention, the guard ring effect can be obtained easily and effectively by forming, in the peripheral portion of the photo detecting region, a semiconductor layer having a larger band gap than that of the semiconductor layer forming the photo detecting region and by extending the pn junction of the photo detecting region into the semiconductor of the large band gap; accordingly, the present invention is of great industrial value.

What we claim is:

1. In an avalanche photo diode, which is provided with a guard ring around a photo detecting region having a pn junction, the improvement comprising: the photo detecting region, being composed of a first semiconductor layer, a second semiconductor layer formed in contact with the first semiconductor layer and forming therewith the pn junction of the photo detecting region said first semiconductor layer being of the same conductivity type as the semiconductor of the guard ring, and a third semiconductor layer formed in contact with the second semiconductor layer and having a larger band gap than the second semiconductor layer, the tip end of the guard ring being formed to extend down into the third semiconductor layer.

2. An avalance photo diode according to claim 1, wherein the band gap of the semiconductor forming the guard ring is larger than the band gaps of the respective semiconductors of the second and third semiconductor layers.

3. In an avalanche photo diode, which is provided with a uniformly thick, first semiconductor layer forming a photo detecting region and a second semiconductor layer forming a first pn junction between the second semiconductor and the first semiconductor layer, the improvement comprising: third and fourth semiconductor layers of the same composition as each other, respectively having larger band gaps than those of the first and second semiconductor layers, being provided to form therebetween a second pn junction which extends from the said first pn junction to surround the peripheral portion of the first semiconductor layer.

* * * * *